US012804963B2

(12) United States Patent
Moens et al.

(10) Patent No.: US 12,804,963 B2
(45) Date of Patent: Nov. 17, 2026

(54) SEMICONDUCTOR DEVICES WITH ORTHOGONAL VOLTAGE BLOCKING STRUCTURES AND METHODS OF MANUFACTURING SEMICONDUCTOR DEVICES

(71) Applicant: SEMICONDUCTOR COMPONENTS INDUSTRIES, LLC, Scottsdale, AZ (US)

(72) Inventors: Peter Moens, Erwetegem (BE); Jan Chochol, Usti nad Labem (CZ)

(73) Assignee: SEMICONDUCTOR COMPONENTS INDUSTRIES, LLC, Scottsdale, AZ (US)

(*) Notice: Subject to any disclaimer, the term of this patent is extended or adjusted under 35 U.S.C. 154(b) by 447 days.

(21) Appl. No.: 18/479,530

(22) Filed: Oct. 2, 2023

(65) Prior Publication Data

US 2025/0113557 A1 Apr. 3, 2025

(51) Int. Cl.
*H01L 29/06* (2006.01)
*H01L 29/16* (2006.01)
(Continued)

(52) U.S. Cl.
CPC ......... *H10D 62/105* (2025.01); *H10D 30/025* (2025.01); *H10D 30/63* (2025.01); *H10D 62/8325* (2025.01)

(58) Field of Classification Search
CPC ............. H10D 30/025; H10D 30/0297; H10D 30/105; H10D 30/106; H10D 30/107;
(Continued)

(56) References Cited

U.S. PATENT DOCUMENTS 11,245,017 B2 2/2022 Kyogoku et al.
11,462,638 B2 * 10/2022 Hsieh .................. H10D 30/668
2020/0295129 A1 * 9/2020 Kinoshita ............ H10D 30/668

FOREIGN PATENT DOCUMENTS

CN 109473474 A 3/2019

OTHER PUBLICATIONS

Y. Ebihara et al., "Suppression of Bipolar Degradation in Deep-P Encapsulated 4H-SiC Trench MOSFETs up to Ultra-High Current Density," In Proc. IEEE 31st International Symposium on Power Semiconductor Devices & ICs, May 19-23, 2019, Shanghai, China.

(Continued)

*Primary Examiner* — David C Spalla
(74) *Attorney, Agent, or Firm* — Kevin B. Jackson

(57) ABSTRACT

A semiconductor device includes a substrate, a first semiconductor region of a first conductivity type over the substrate and a second semiconductor region of the first conductivity type over the first semiconductor region. A trench gate structure includes a trench in the second semiconductor region, a gate conductor, and a gate dielectric separating the gate conductor from the second semiconductor region. A first doped region of a second conductivity type is in the first semiconductor region, wherein the first doped region and the first semiconductor region provide a first charge-balance region. A second doped region of the second conductivity type is in the second semiconductor region and interposed between the trench gate structure and the first doped region, wherein the second doped region and the second semiconductor region provide a second charge-balance region. The second doped region is self-aligned with the trench gate structure.

20 Claims, 10 Drawing Sheets

(51) Int. Cl.
*H01L 29/66* (2006.01)
*H01L 29/78* (2006.01)
*H10D 30/01* (2025.01)
*H10D 30/63* (2025.01)
*H10D 62/10* (2025.01)
*H10D 62/832* (2025.01)

(58) Field of Classification Search
CPC .. H10D 30/63; H10D 30/668; H10D 32/8325; H10D 64/01366; H10D 64/513
See application file for complete search history.

(56) References Cited

OTHER PUBLICATIONS

Y. Kobayashi et al., “High-temperature Performance of 1.2 kV-class SiC Super Junction MOSFET,” In Proc. IEEE 31st International Symposium on Power Semiconductor Devices & ICs, May 19-23, 2019, Shanghai, China.

R. Ghandi et al., “4.5kV SiC Charge-Balanced MOSFETs with Ultra-Low On-Resistance,” In Proc. IEEE 32nd International Symposium on Power Semiconductor Devices and ICs (ISPSD) Sep. 13-18, 2020, Vienna, Austria.

H. Takaya et al., “4H-SiC Trench MOSFET with low on-resistance at high temperature,” In Proc. IEEE 32nd International Symposium on Power Semiconductor Devices and ICs (ISPSD) Sep. 13-18, 2020, Vienna, Austria.

International Search Report and Written Opinion for PCT/US2024/028564, mailed Nov. 11, 2024, 22 pages.

Partial International Search Report for PCT/US2024/028564, mailed Sep. 12, 2024, 13 pages.

* cited by examiner

SEMICONDUCTOR DEVICES WITH ORTHOGONAL VOLTAGE BLOCKING STRUCTURES AND METHODS OF MANUFACTURING SEMICONDUCTOR DEVICES

CROSS-REFERENCE TO RELATED APPLICATIONS

Not applicable.

TECHNICAL FIELD

The present disclosure relates, in general, to electronics and, more particularly, to semiconductor device structures and methods of forming semiconductor devices.

BACKGROUND

Silicon Carbide (SiC) semiconductor devices, such as SiC MOSFETs, have several advantageous features in comparison to traditional silicon-based devices. For example, SiC MOSFETs are better suited for certain high-power applications because SiC MOSFETs are capable of handling high voltages and high operating temperatures. Further, SiC MOSFETs have a low drain-to-source on-resistance (RDSON), (when designed with a short channel region) and fast switching with low power losses, resulting in highly efficient operation. The short channel region design requirement is necessary because SiC MOSFETs have relatively low channel mobility compared to silicon-based devices.

Some progress has been made in improving the performance of SiC MOSFETs by, for example, shrinking the cell pitch to improve on-resistance, by using trench gate structures to improve channel mobility, and by using charge-balance or super-junction (SJ) structures to reduce drift region resistance. However, implementing these techniques has been a challenge because of trade-offs with other performance characteristics that are adversely affected, such as breakdown voltage ($BV_{DSS}$).

Accordingly, structures and methods are needed that, among other things, facilitate the use of the techniques described above without impacting other performance characteristics, such a breakdown voltage. It would be beneficial for such structures and methods to be cost effective and readily manufacturable.

Figure 1:
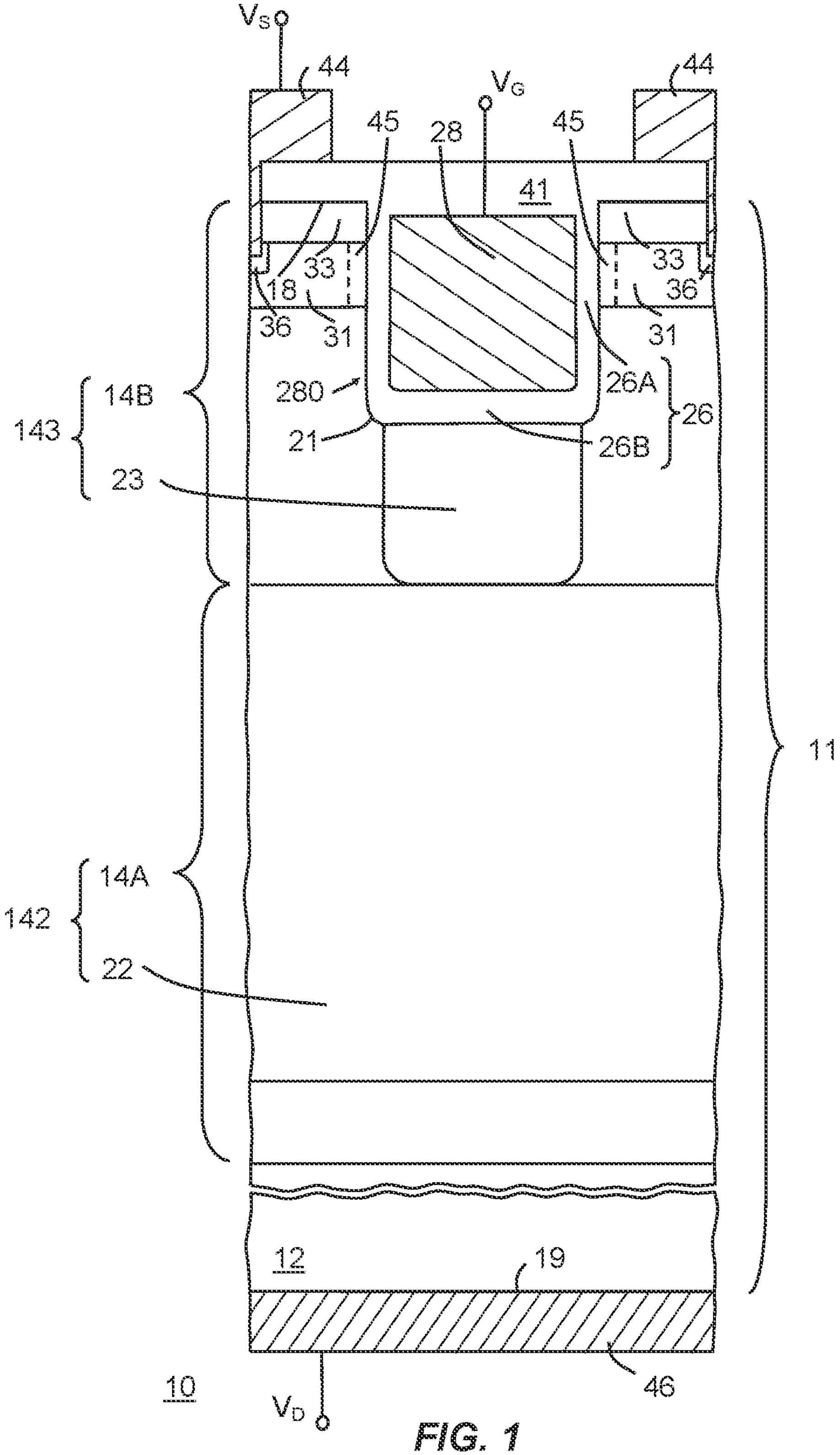
FIG. 1 illustrates a partial cross-sectional view of a semiconductor device in accordance with the present description.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

For simplicity and clarity of the illustration, elements in the figures are not necessarily drawn to scale, and the same reference numbers in different figures denote the same elements. Additionally, descriptions and details of well-known steps and elements are omitted for simplicity of the description.

For clarity of the drawings, certain regions of device structures, such as doped regions or dielectric regions, trenches, or contacts may be illustrated as having generally straight-line edges and precise angular corners. However, those skilled in the art understand that, due to the diffusion and activation of dopants or formation of layers, the edges of such regions generally may not be straight lines and that the corners may not be precise angles.

Although the semiconductor devices are explained herein as certain N-type conductivity regions and certain P-type conductivity regions, a person of ordinary skill in the art understands that the conductivity types can be reversed and are also possible in accordance with the present description, considering any necessary polarity reversal of voltages, inversion of transistor type and/or current direction, etc.

In addition, the terminology used herein is for the purpose of describing particular examples only and is not intended to be limiting of the disclosure. As used herein, the singular forms are intended to include the plural forms as well, unless the context clearly indicates otherwise.

As used herein, "current-carrying electrode" means an element of a device that carries current through the device, such as a source or a drain of an MOS transistor, an emitter or a collector of a bipolar transistor, or a cathode or anode of a diode, and a "control electrode" means an element of the device that controls current through the device, such as a gate of a MOS transistor or a base of a bipolar transistor.

The term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions.

The terms "comprises", "comprising", "includes", "including", "has", "have" and/or "having" when used in this description, are open ended terms that specify the presence of stated features, numbers, steps, operations, elements, and/or components, but do not preclude the presence or addition of one or more other features, numbers, steps, operations, elements, components, and/or groups thereof.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

Although the terms "first", "second", etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

It will be appreciated by one skilled in the art that words, "during", "while", and "when" as used herein related to circuit operation are not exact terms that mean an action takes place instantly upon an initiating action but that there may be some small but reasonable delay, such as propagation delay, between the reaction that is initiated by the initial action. Additionally, the term "while" means a certain action occurs at least within some portion of a duration of the initiating action.

The use of word "about", "approximately", or "substantially" means a value of an element is expected to be close to a state value or position. However, as is well known in the art there are always minor variances preventing values or positions from being exactly stated.

Unless specified otherwise, as used herein, the word "over" or "on" includes orientations, placements, or relations where the specified elements can be in direct or indirect physical contact.

Unless specified otherwise, as used herein, the word "overlapping" includes orientations, placements, or relations where the specified elements can at least partly or wholly coincide or align in the same or different planes.

It is further understood that the examples illustrated and described hereinafter suitably may have examples and/or may be practiced in the absence of any element that is not specifically disclosed herein.

DESCRIPTION

In general, the present examples relate to semiconductor device structures and methods of making semiconductor devices, such as SiC MOSFET devices, having improved manufacturability and performance. More particularly, structures and methods are described that use a first charge-balance region and a second charge-balance region, which is over the first charge-balance region. In some examples, the first charge-balance region comprises a first doped region in a first semiconductor region and the second charged-balanced region comprises a second doped region in a second semiconductor region. In some examples, the first semiconductor region and the second semiconductor region comprise a first conductivity type (for example, N-type conductivity), and the first doped region and the second doped region comprise a second conductivity type (for example, P-type conductivity) opposite to the first conductivity type.

The structures can include a trench gate structure within the second semiconductor region with the second doped region interposed between the trench gate structure and the first doped region. In some examples, the second doped region is self-aligned to the trench gate structure. For example, the second doped region can be formed in the second semiconductor region using a spacer structure within or in a trench at an early stage of fabricating the trench gate structure. The spacer structure can provide lateral confinement of the second doped region in the second semiconductor region with respect to the trench gate structure, which applicant found can be used to improve short circuit withstand time (SCWT) by, for example, adding a JFET resistance in series with a channel region of the semiconductor device.

In some examples, the first doped region comprises first elongate stripe doped regions and the second doped region comprises second elongate stripe doped regions that is orthogonally oriented to the first elongate stripe doped regions in a top view. Applicant found that this non-parallel orientation improves breakdown voltage performance by reducing sensitivity to misalignment between the second doped region and the first doped region during manufacturing.

In some examples, a third doped region of the first conductivity type (for example, N-type conductivity) can be provided proximate to where the second elongate stripe doped regions intersect or overlaps the first elongate stripe doped regions in the top view to provide further breakdown voltage performance improvement or reduce specific on-resistance. In some examples, the first doped region and the second doped region are coupled to a source potential. The structures and methods provide, among other things, semiconductor devices that support smaller feature sizes, such as reduced cell pitches, and that are more manufacturable and reliable compared to previous device structures and methods.

In an example, a semiconductor device includes a body of semiconductor material including a substrate, a first semiconductor region of a first conductivity type over the substrate and a second semiconductor region of the first conductivity type over the first semiconductor region. In some examples, the second semiconductor region provides a first side of the body of semiconductor and the substrate provides a second side of the body of semiconductor material opposite to the first side. A trench gate structure includes a trench extending into the second semiconductor region from the first side, a gate conductor in the trench, and a gate dielectric separating the gate conductor from the second semiconductor region. A first elongate stripe doped region of a second conductivity type opposite to the first conductivity type is in the first semiconductor region, wherein the first elongate stripe doped region and the first semiconductor region provide a first charge-balance region. A second elongate stripe doped region of the second conductivity type is in the second semiconductor region and interposed between the trench gate structure and the first elongate stripe doped region, wherein the second elongate stripe doped region and the second semiconductor region provide a second a second charge-balance region. The second elongate stripe doped region is orthogonal to the first elongate stripe doped region in a top view.

In an example, a semiconductor device includes a substrate, a first semiconductor region comprising a first conductivity type over the substrate, and a second semiconductor region of the first conductivity type over the first semiconductor region. In some examples, the second semiconductor region provides a first side of the body of semiconductor and the substrate provides a second side of the body of semiconductor material opposite to the first side. A trench gate structure includes a trench extending into the semiconductor region from the first side, a gate conductor within the trench, and a gate dielectric separating the gate conductor from the second semiconductor region. A first doped region of a second conductivity type opposite to the first conductivity type is within the first semiconductor region, wherein the first doped region and the first semiconductor region provide a first charge-balance region. A second doped region of the second conductivity type is within the second semiconductor region and interposed between the trench gate structure and the first doped region, wherein the second doped region and the second semiconductor region provide a second charge-balance region. The second doped region is self-aligned with the trench gate structure.

In an example, a method for manufacturing a semiconductor device includes providing a substrate, providing a first semiconductor region over the substrate and comprising a first conductivity type, and providing a first doped region of a second conductivity type opposite to the first conductivity type in the first semiconductor region, wherein the first doped region and the first semiconductor region provide a first charge-balance region. The method includes providing a second semiconductor region over the first semiconductor region and comprising the first conductivity type. The method includes providing a trench extending into the second semiconductor region, the trench comprising side walls and a lower side and providing a spacer structure along the side walls of the trench. The method includes using the spacer structure to provide a second doped region of the second conductivity type in the second semiconductor region and interposed between the lower side of the trench and the first doped region, wherein the second doped region and the second semiconductor region provide a second charge-balance region. The method includes providing a gate dielectric along the side walls and the lower side of the trench and providing a gate conductor within the trench, wherein the gate dielectric isolates the gate conductor from the second semiconductor region and the second doped region.

Other examples are included in the present disclosure. Such examples may be found in the figures, in the claims, or in the description of the present disclosure.

FIG. 1 illustrates a partial cross-sectional view of a semiconductor device 10 in accordance with the present description. In the present example, semiconductor device 10 comprises an N-channel SiC MOSFET device and includes a body of semiconductor material 11. It is understood that the present description is relevant as well to P-channel devices. Body of semiconductor material can also be referred to as a region of semiconductor material, a semiconductor workpiece, or a workpiece. In some examples, body of semiconductor material 11 comprises a substrate 12, a first semiconductor region 14A over substrate 12, and a second semiconductor region 14B over first semiconductor region 14A. In the present example, first semiconductor region is interposed between substrate 12 and second semiconductor region 14B. First semiconductor region 14A can also be referred to as a first epitaxial region, a first as-grown region, or a first semiconductor layer. Second semiconductor region 14B can also be referred to as a second epitaxial region, a second as-grown region, or a second semiconductor layer. In some examples, first semiconductor region 14A and second semiconductor region 14B comprise SiC epitaxial regions.

In an example where semiconductor device 10 comprises a 650 volt rated SiC MOSFET, substrate 12 can be a SiC substrate, can have a first conductivity type (for example, N-type conductivity), and can have a dopant concentration of about $5.0\times10^{18}$ atoms/cm$^3$. In the 650 volt example, first semiconductor region 14A can comprise SiC, can have the first conductivity type (for example, N-type conductivity), a dopant concentration in a range from about 5.01016 atoms/cm$^3$ and $5.0\times10^{17}$ atoms/cm$^3$, and can have thickness in a range from about 0.5 microns to about 3.0 microns. In the 650 volt example, second semiconductor region 14B can comprise SiC, can have the first conductivity type (for example, N-type conductivity), can have a dopant concentration in a range from about $5.0\times10^{16}$ atoms/cm$^3$ and $5.0\times10^{17}$ atoms/cm$^3$, and can have a thickness in a range from about 1.0 microns to about 3.0 microns. The thicknesses, dopant concentrations, or dopant profiles of first semiconductor region 14A and second semiconductor region 14B can be adjusted in accordance with desired breakdown voltage characteristics for semiconductor device 10.

In the present example, second semiconductor region 14B provides a top side 18 of body of semiconductor material 11 and substrate 12 provides a bottom side 19 of body of semiconductor material 11. In the present example, bottom side 19 is opposite to top side 18. Top side 18 can also be referred to as a first side of body of semiconductor material 11 and bottom side 19 can also be referred to as a second side of body of semiconductor material 11.

A first doped region 22 is within or in first semiconductor region 14A. In the present example, first doped region 22 comprises a second conductivity type (for example, P-type conductivity) opposite to the first conductivity type. In accordance with the present example, first doped region 22 and first semiconductor region 14A form, provide, or are configured as a first charge-balance region 142 for semiconductor device 10. First charge-balance region 142 can also be referred to as a lower charge-balance region, a lower charge-balance structure, a first charge-balancing region, a first super-junction structure, or a lower super-junction structure. In some examples, first doped region 22 comprises a dopant concentration in a range from about $5.0\times10^{16}$ atoms/cm$^3$ to about $5.0\times10^{17}$ atoms/cm$^3$. In some examples, first doped region 22 extends to depth within first semiconductor region 14A in a range from about 0.5 microns to about 3.0 microns. In some examples, first doped region 22 terminates within first semiconductor region 14A without reaching substrate 12.

Figure 3:
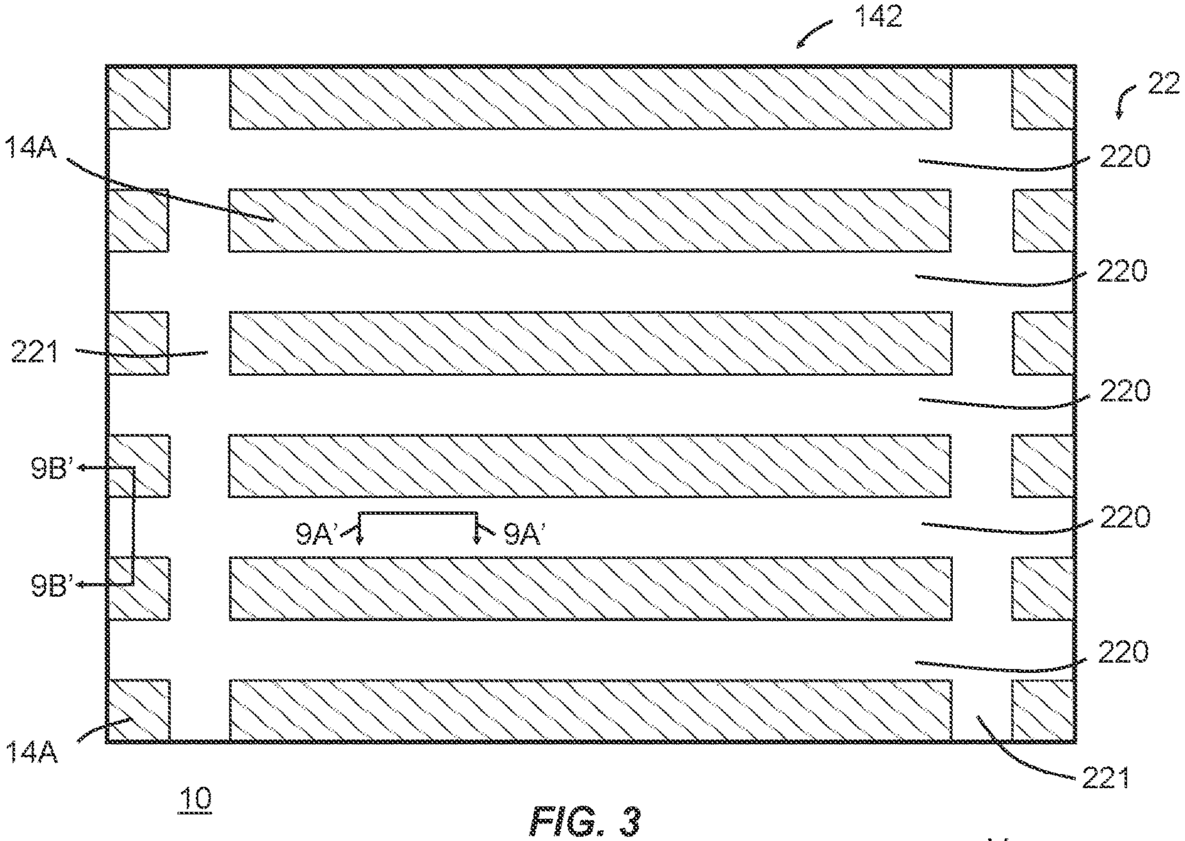
FIG. 3 illustrates a partial top view of a lower charge-balance region as part of a semiconductor device in accordance with the present description.

In some examples and with temporary reference to FIG. 3, first doped region 22 comprises a first elongate stripe doped region 220 and can be among a plurality of first elongate stripe doped regions 220. First doped region 22 can also be referred to as a first pillar region.

A second doped region 23 is within or in second semiconductor region 14B. In some examples, second doped region 23 is coupled electrically and physically to first doped region 22. In some examples, second doped region 23 can partially extend into an upper part of first doped region 22. In the present example, second doped region 23 comprises the second conductivity type (for example, P-type conductivity). In accordance with the present example, second doped region 23 and second semiconductor region 14B form, provide, or are configured as a second charge-balance region 143. Second charge-balance region 143 also can be referred to as an upper charge-balance region, an upper charge-balance structure, a second charge-balancing region, a second super-junction, or an upper super-junction structure. In some examples, second doped region 23 comprises a dopant concentration in a range from about $5.0\times10^{16}$ atoms/cm$^3$ to about $5.0\times10^{17}$ atoms/cm$^3$.

Figure 5:
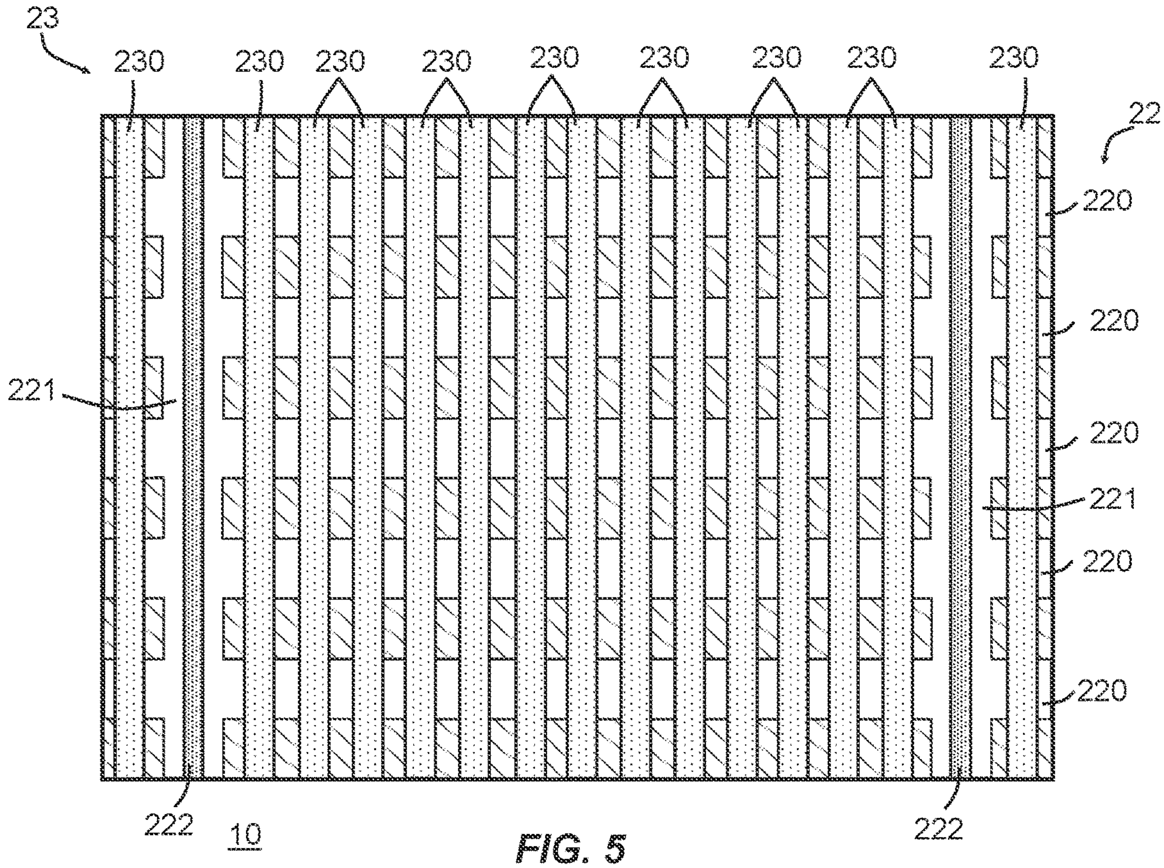
FIG. 5 illustrates a partial top view of an upper charge-balance region and the lower charge-balance region as part of a semiconductor device in accordance with the present description.

In some examples and with temporary reference to FIG. 5, second doped region 23 can comprise a second elongate stripe doped region and can be among a plurality of second elongate stripe doped regions 230. Second doped region 23 can also be referred to as a second pillar region.

In some examples, semiconductor device 10 comprises a trench gate structure 280 within or in second semiconductor region 14B. In the present example, second doped region 23 is interposed between trench gate structure 280 and first doped region 22. Trench gate structure 280 includes a trench 21 extending inward from top side 18 into second semiconductor region 14B. A gate dielectric 26 is over side walls and a lower side of trench 21, and a conductor 28 is over gate dielectric 26 within or in trench 21. Gate dielectric 26 insulates or electrically separates conductor 28 from second semiconductor region 14B. Conductor 28 can also be referred to as a gate conductor, a gate electrode, or a control electrode. In some examples, conductor 28 can comprise doped polysilicon or other conductive materials.

In some examples, gate dielectric 26 comprises a first portion 26A along the side walls of trench 21 and a second portion 26B at the lower side of trench 21. In some examples, gate dielectric 26 can comprise an oxide or a nitride and can have a thickness in a range from about 200 Angstroms to about 1000 Angstroms. In some examples, the gate dielectric can contain any of the following materials: Hf, Al, La, O, N, Si, P, Bi, B, Li. In some examples, first portion 26A comprises a first thickness and second portion 26B comprises a second thickness that is greater than the first thickness. In some examples, this configuration of gate dielectric 26 reduces switching losses. In some examples, the second thickness can be about 1.2× to about 10× greater than the first thickness.

In accordance with the present description, second doped region 23 is self-aligned to trench gate structure 280. In some examples (as will be explained in more detailed later), a spacer structure can be used to form second doped region 23 through the lower side of trench 21 to self-align doped region 23 to trench gate structure 280. In addition, the spacer structure can be used to laterally confine second doped region 23 with respect to trench gate structure 280.

Semiconductor device 10 comprises a doped region or regions 31 of the second conductivity type (for example, P-type conductivity) within second semiconductor region 14B adjacent to trench gate structure 280. In some examples, doped region 31 is a single interconnected doped region, such as a plurality of interconnected stripe portions. In other examples, doped region 31 can be a plurality of separate doped regions, such as separate cell or stripe cell regions. In some examples, doped region 31 extends into second semiconductor region 14B to a depth in a range from about 0.2 microns and about 1.0 microns. Doped region 31 provides a body region or base region for semiconductor device 10.

Semiconductor device 10 further comprises a doped region 33 comprising the first conductivity type (for example, N-type conductivity) and a doped region 36 comprising the second conductivity type (for example, P-type conductivity) type within or in doped region 31. In some examples, doped region 33 provides a source region for semiconductor device 10. Doped region 33 can also be referred to as a current carrying region. Doped region 36 provides enhanced contact to doped region 31 and can reduce certain parasitic effects.

Semiconductor device further comprises a dielectric 41 overlying top side 18 and trench gate structure 280. In some examples, dielectric 41 comprises one or more dielectric or insulative layers and can be configured as an inter-layer dielectric (ILD) structure. In some examples, dielectric 41 can comprise a silicon oxide, such as a doped or undoped deposited silicon oxide. In some examples, dielectric 41 can comprise a layer of deposited silicon oxide doped with phosphorous or boron and phosphorous and at least one layer of undoped oxide. In some examples, dielectric 41 can have a thickness from about 0.4 microns to about 1.0 microns. Dielectric 41 can be planarized to provide a more uniform surface topography, which improves manufacturability.

Semiconductor device 10 comprises a conductor 44 over portions of top side 18 coupled to doped region 33 and doped region 36. In some examples, conductor 44 is coupled to first doped region 22 and second doped region 23 in another location on semiconductor device 10. In some examples, conductor 44 can comprise nickel, nickel silicide, titanium, or other conductive materials. In some examples, a conductor 46 is provided over bottom side 19 of body of semiconductor material 11 and is coupled to substrate 12. In some examples, conductor 46 can comprise a plurality of metal layers, such as nickel-titanium-nickel-silver, chrome-nickel-gold, or other conductive materials. Conductors 44 and 46 can be formed using deposition processes, such as evaporation, sputtering, or other techniques as known to one of ordinary skill in the art. In some examples, conductor 44 can be referred to a current carrying electrode or a source electrode and conductor 46 can be referred to as a current carrying electrode or a drain electrode. With an appropriate gate voltage applied to conductor 28 a channel region 45 is formed in doped region 31 proximate to top side 18 that allows for current to flow in semiconductor device 10.

In one example, the operation of semiconductor device 10 proceeds as follows. With conductor 44 and doped regions 33 receiving a source potential $V_S$ of zero volts, conductor 28 receiving a control voltage $V_G$ of 10 volts, which is greater than the threshold voltage of semiconductor device 10, and conductor 46 receiving a drain potential $V_D$ of 0.5 volts, channel regions 45 form in doped region 31. Channel regions 45 electrically connect source regions to second semiconductor region 14B and a device current $I_S$ flows from conductor 44, through channel regions 45, second semiconductor region 14B, first semiconductor region 14A to conductor 46. The high dopant concentration of first semiconductor region 14A and second semiconductor region 14B provide a low on-resistance for semiconductor device 10. In some examples, device current $I_S$ can be 500 amperes.

To switch semiconductor device 10 to an off state, the control voltage $V_G$ that is less than the threshold voltage of semiconductor device 10 is applied to gate conductor 28 (for example, less than 2.0 volts). This removes channel regions 45 and device current no longer flows through semiconductor device 10. In the off state, first semiconductor region 14A (N-type conductivity) and first doped region 22 (P-type conductivity) and second semiconductor region 14B (N-type conductivity) and second doped region 23 (P-type conductivity) compensate each other as a depletion region from a PN junction formed between doped region 31 and second semiconductor region 14B spreads. This charge-balancing effect enhances the breakdown voltage ($BV_{DSS}$) of semiconductor device 10.

Experimental results for semiconductor device 10 rated as a 650 volt device in the on-state show a threshold voltage of about 3.1 volts, an on-resistance at a $V_{GS}$ of 18 volts, room temperature of 0.45 milli-ohm·cm$^2$, and an on-resistance at a $V_{GS}$ of 18 volts at, 175 degrees Celsius of 0.77 mill-ohm·cm$^2$. The experimental results for this semiconductor device 10 showed a breakdown voltage of 785 volts.

Example figures of merit (FOM) included an $R_{ON}*Q_g$ of 715 milli-ohm·nC, an $R_{ON}*Q_{OSS}$ of 985 milli-ohm·nC, and an Ron*$E_{OSS}$ of 90 milli-ohm·C. In addition, semiconductor device 10 in accordance with the present description was found to have an electric field across gate dielectric 26 ($E_{OX}$) of less than 3.0 MV/cm at a $V_{DS}$ of approximately 600 volts and a $V_{GS}$ of 0 volts.

Figure 2:
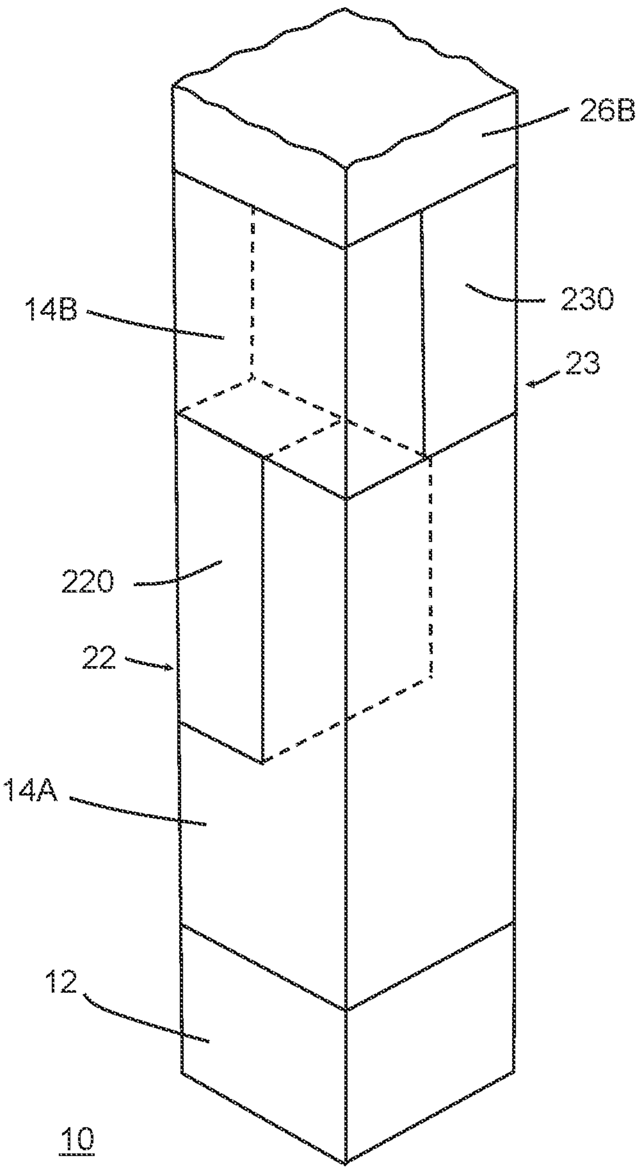
FIG. 2 illustrates a partial side perspective view of a semiconductor device in accordance with the present description.

FIG. 2 illustrates a partial side perspective view of semiconductor device 10 in accordance with the present description. In the example shown in FIG. 2, first doped region 22 and second doped region 23 are illustrated as an elongate stripe doped regions that are non-parallel to each other. In some examples, the elongate stripe doped regions are orthogonal to each other. This non-parallel orientation was found by applicant to improve breakdown voltage performance by reducing sensitivity to misalignment between the second doped region and the first doped region during manufacturing.

FIG. 3 illustrates a partial top view of a lower charge-balance region, such as first charge-balance region 142, as part of semiconductor device 10 in accordance with the present description. In the present example, first doped region 22 is provided as part of a plurality of first elongate stripe doped regions 220 within first semiconductor region 14A. Second semiconductor region 14B is not illustrated in FIG. 3 for case of illustrating the top view of first charge-balance region 142. In some examples, each one of first elongate stripe doped regions 220 is parallel and spaced apart from an adjacent one of first elongate stripe doped regions 220 so that a portion of first semiconductor region 14A is interposed between adjacent ones of first elongate stripe doped regions 220.

In some examples, a doped region 221 is provided to couple first elongate stripe doped regions 220 together. Doped region 221 comprises the same conductivity type as doped region 22 (for example, P-type conductivity) and comprises a dopant concentration sufficient to provide electrical contact to first elongate stripe doped regions 220. In some examples, doped region 221 can comprise an elongate stripe doped region that orthogonal to first elongate stripe doped regions 220. Doped region 221 can also be referred to as a contact region, a coupling region, a pillar, or a sinker region.

Figure 4:
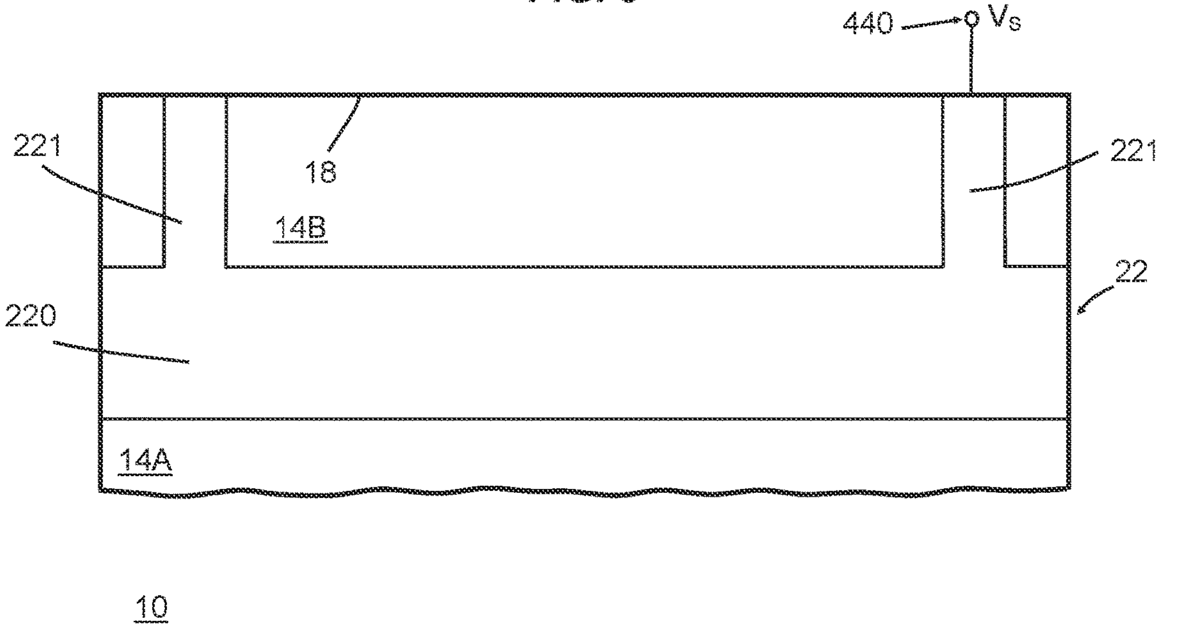
FIG. 4 illustrates a partial cross-sectional view of a lower charge-balance region.

FIG. 4 illustrates a partial cross-sectional view of first charge-balance region 142 with second semiconductor region 14B over first semiconductor region 14A and one of first elongate stripe doped regions 220 of doped region 22. In the present example, doped region 221 extends from top side 18 through second semiconductor region 14B to contact first doped region 22 in first semiconductor region 14A. In some examples, doped region 221 is configured to electrically couple first doped region 22 and second doped region 23 to a common connection 440, which can be coupled to the source potential ($V_S$) when semiconductor device 10 is in use. In some examples, conductor 44 can be coupled to both doped regions 33 and doped region 221 so that first doped region 22 and second doped region 23 are at the same potential ($V_S$) as doped regions 33. First doped region 22 and doped region 221 can be formed using masking and doping process techniques. In some examples, doped region 221 can comprise a dopant concentration in a range from about $1.0\times10^{17}$ atoms/cm$^3$ to about $2.0\times10^{18}$ atoms/cm$^3$.

Figure 6:
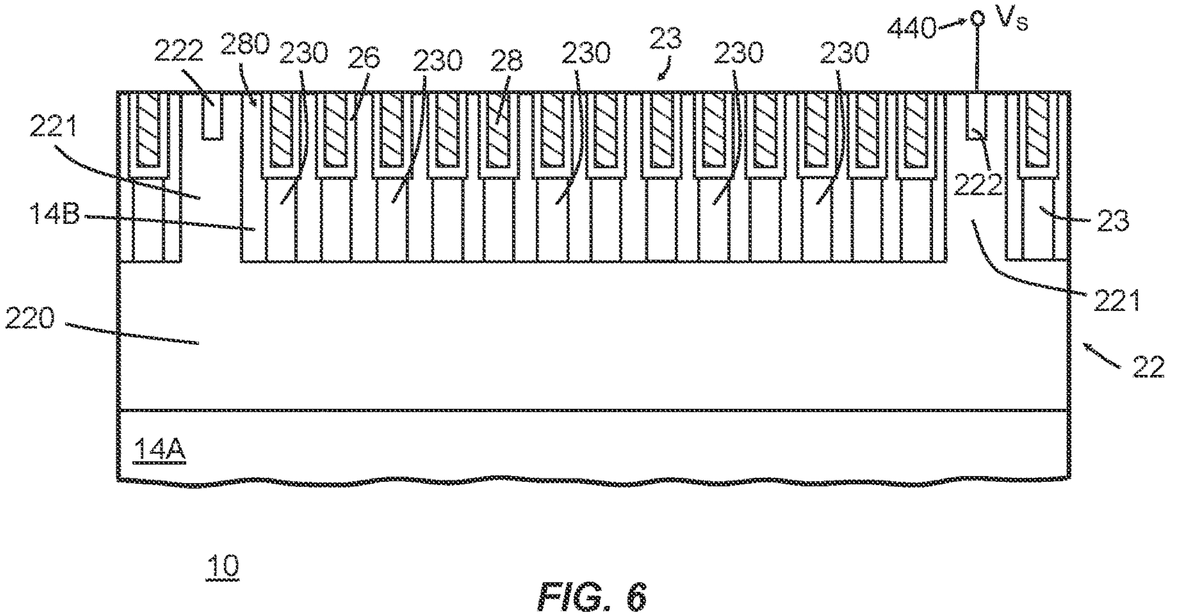
FIG. 6 illustrates a partial cross-sectional view of a semiconductor device including an upper charge-balance region, a lower charge-balance region, and a trench gate structure in accordance with the present description.

FIG. 5 illustrates a partial top view of an upper charge-balance region, such as second charge-balance region 143, as part of semiconductor device 10 in accordance with the present description. Trench gate structures 280 are not illustrated in FIG. 5 for case of understanding the figure but are illustrated in FIG. 6. In the present example, second doped region 23 is provided as part of a plurality of second elongate stripe doped regions 230 within second semiconductor region 14B. In some examples, each of second elongate stripe doped regions 230 is parallel and spaced apart from an adjacent one of second elongate stripe doped regions 230 so that a portion of second semiconductor region 14B is interposed between adjacent ones of second elongate stripe doped regions 230. In accordance with the present description, second elongate stripe doped regions 230 are non-parallel to first elongate stripe doped regions 220 in a top view. In some examples, second elongate stripe doped regions 230 are orthogonal to first elongate stripe doped regions 220 in the top view. As illustrated in FIG. 5, each one of first elongate stripe doped regions 220 intersects multiple (two or more) of second elongate stripe doped regions 230 in the top view and each one of second elongate stripe doped regions 230 intersects multiple ones of first elongate stripe doped regions 220 in the top view.

In some examples, semiconductor device 10 comprises doped region 222 within or in doped region 221. Doped region 222 comprises the same conductivity type (for example, P-type conductivity) as doped region 221 and can have a higher dopant concentration than doped region 221. Doped region 222 can be referred to as an enhancement region or a contact region and is configured to provide low contact resistance to, for example, conductor 44. In some examples, doped region 222 can comprise an elongate stripe dope region.

FIG. 6 illustrates a partial cross-sectional view of semiconductor device 10 including first charge-balance region 142 and second charge-balance region 143, and further including trench gate structures 280. In accordance with the present description doped regions 23, which can comprise second elongate stripe doped regions 230, are self-aligned to trench gate structures 280.

Doped region 221 can be placed in various locations on semiconductor device 10 between adjacent trench gate structures 280. In some examples, doped regions 221 can be interposed between adjacent trench gate structures 280. FIG. 6 further illustrates doped region 222 within or in doped region 221. Doped region 222 can provide better ohmic contact for coupling doped region 22 and doped region 23 to the source potential ($V_S$) through common connection 440.

Figure 7:
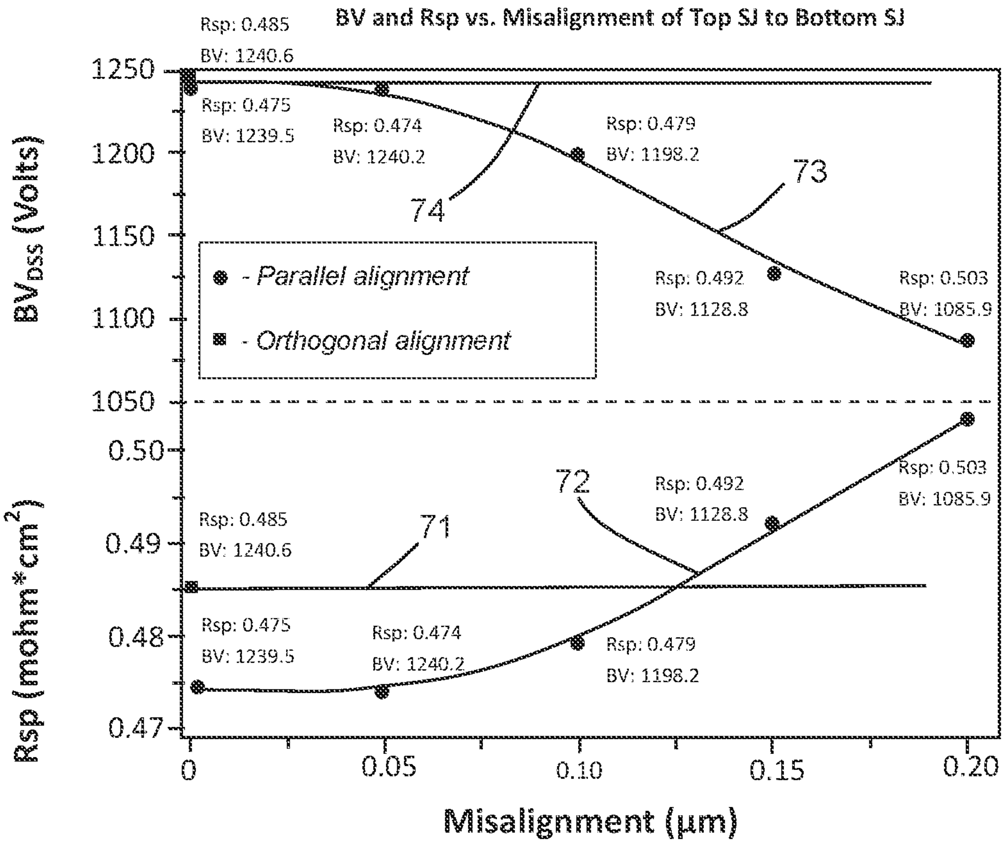
FIG. 7 graphically illustrates specific on-resistance ($R_{SP}$ in milli (m)-ohm*cm$^2$) and breakdown voltage ($BV_{DSS}$ in Volts) versus pattern misalignment between first elongate stripe doped regions and second elongate stripe doped regions in a parallel alignment configuration and an orthogonal alignment configuration.

FIG. 7 graphically illustrates specific on-resistance $R_{SP}$ (in milli (m)-ohm*cm$^2$) and breakdown voltage $BV_{DSS}$ (Volts) versus misalignment between second elongate stripe doped regions 230 in second charge-balance region 143 and first elongate stripe doped regions 220 in first charge-balance region 142 in a parallel alignment configuration and an orthogonal alignment configuration. Misalignment issues can be caused by photolithographic or patterning issues in subsequent masking steps during fabrication. Data line 71 is specific on-resistance data where first elongate stripe doped regions 220 and second elongate stripe doped regions 230 are in an orthogonal orientation in accordance with the present description; data line 72 is specific on-resistance data where first elongate stripe doped regions 220 and second elongate stripe doped regions 230 are in parallel alignment; data line 73 is breakdown voltage data where first elongate stripe doped regions 220 and second elongate stripe doped regions 230 are in parallel alignment; and data line 74 is breakdown voltage data where first elongate stripe doped regions 220 and second elongate stripe doped regions 230 are in orthogonal alignment.

FIG. 7 shows that the orthogonal orientation of first elongate stripe doped regions 220 and second elongate stripe doped regions 230 reduces the impact of pattern misalignment on the breakdown voltage of semiconductor device 10. In addition, FIG. 7 shows that the parallel configuration is much more susceptible to degradation in both breakdown voltage and specific on-resistance particularly as the amount misalignment increases. The specific on-resistance for the orthogonal configuration is about 2% greater than the parallel configuration, which applicant believes results from forward current flowing through a quarter of the charge-balance structures in the orthogonal orientation compared to half of the charged-balanced structures in the parallel orientation.

Figure 8:
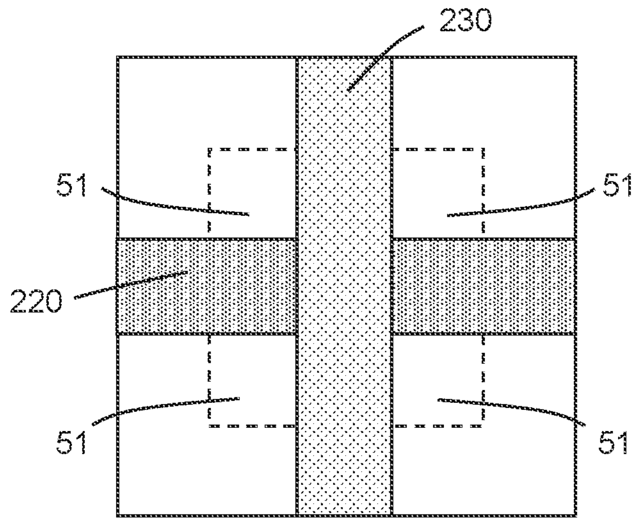
FIG. 8 illustrates a partial top view of an elongate stripe doped region in an upper charge-balance region and an elongate stripe dope region in a lower charge-balance region at crossing location in accordance with the present description.

FIG. 8 illustrates a partial top view of location on semiconductor device 10 where one of first elongate stripe doped regions 220 and one of second elongate stripe doped regions 230 cross, overlap, or intersect. Applicant found that by including a third doped region 51 comprising the first conductivity type (for example, N-type conductivity), the specific-on resistance can be reduced in accordance with the present description. In addition, third doped region 51 can be used to counter-dope portions of first elongate stripe doped regions 220 or second elongate stripe doped regions 230 to control depletion region profiles in semiconductor device 10 resulting from the non-parallel orientation to further enhance breakdown voltage.

FIGS. 9A, 9B, 10, 11, 12, and 13 illustrates partial cross-sectional views of a semiconductor device, such as semiconductor device 10, at various stages of manufacture in accordance with the present description. The following description is an example for a 650 volt SiC MOSFET device. Those of ordinary skill in the art will appreciate that, among other things, dopant concentrations and thicknesses of the various regions can be adjusted to achieve other voltage rated devices.

Figure 9A:
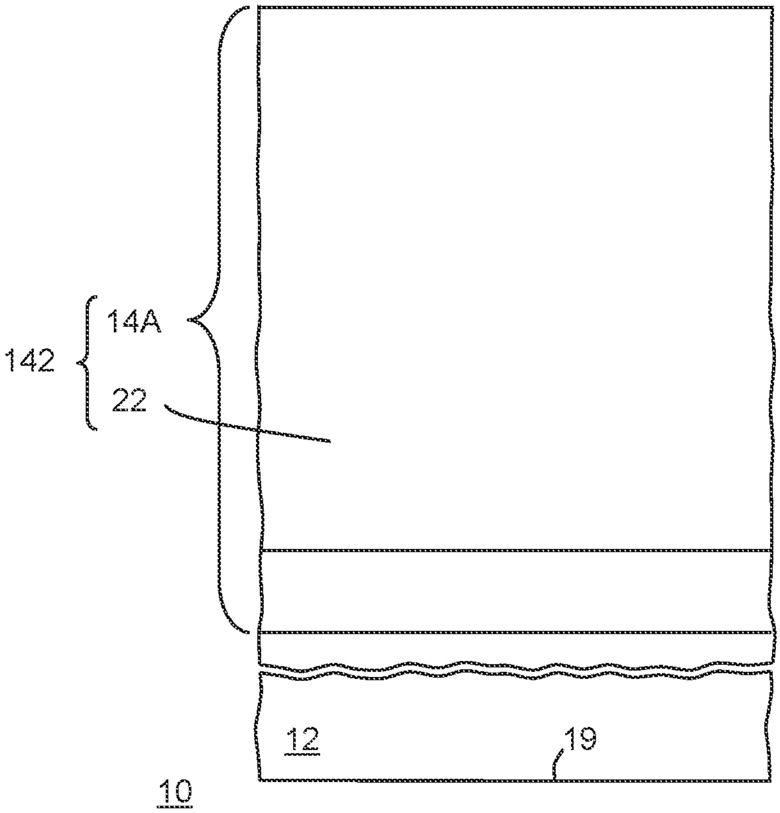
FIGS. 9A, 9B, 10, 11, 12, and 13 illustrates partial cross-sectional views of a semiconductor device at various stages of manufacture in accordance with the present description.
Figure 9B:
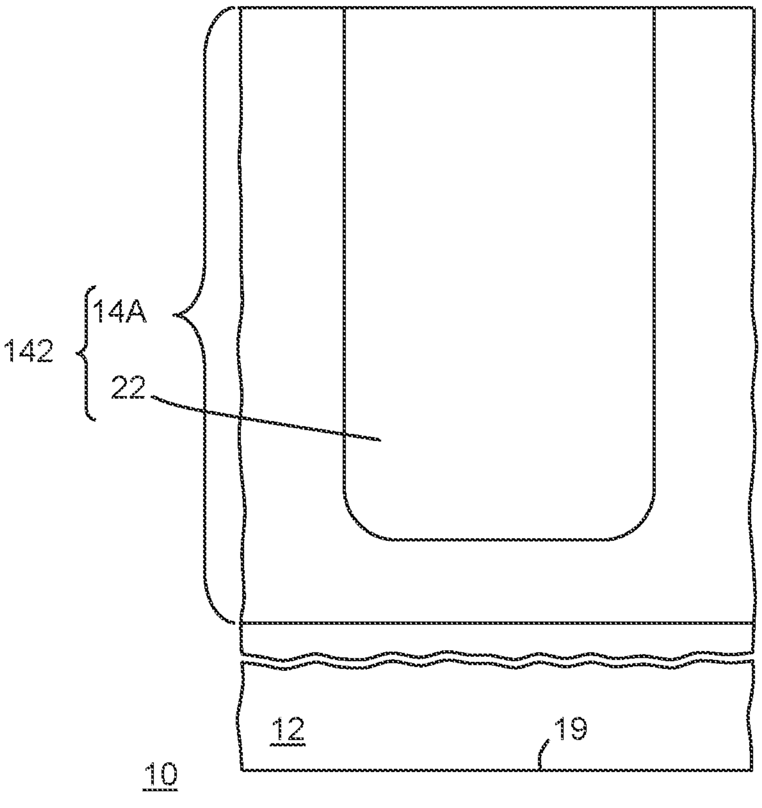

FIG. 9A illustrates a partial cross-sectional view of a portion semiconductor device 10, for example, taken along reference line 9A'-9A' of FIG. 3 at an early step in manufacture. FIG. 9B illustrates a partial cross-sectional view from a different orientation of semiconductor device 10, for example, taken along reference line 9B'-9B' of FIG. 3. In some examples, substrate 12 comprises a SiC substrate with an N-type conductivity and a dopant concentration of about $5.0\times10^{18}$ atoms/$cm^3$.

In some examples, first semiconductor region 14A is provided over substrate 12. In some examples, first semiconductor region 14A comprises a SiC epitaxial region comprising N-type conductivity formed using epitaxial growth process techniques with phosphorous or nitrogen doping. In some examples, first semiconductor region 14A comprises a dopant concentration a range from about $5.0\times10^{16}$ atoms/$cm^3$ and $5.0\times10^{17}$ atoms/$cm^3$ and can have thickness in a range from about 0.5 microns to about 3.0 microns.

In some examples, masking and doping process techniques can be used to provide first doped region 22 within or in selected portions of first semiconductor region 14A. In some examples, ion implantation and dopant redistribution processes can be used to form doped region 22. In some examples, ion implantation is used with an aluminum dopant source, an ion implantation dose in a range from about $2.0\times10^{12}$ atoms/$cm^2$ to $5.0\times10^{13}$ atoms/$cm^2$, and ion implantation energy in a range from about 50 keV to about 3.0 MeV. In some examples, multiple ion implants can be used with different doses or different energies. Thermal processing can then be used to redistribute and activate the implanted dopant to provide first doped region 22. In some examples, first doped region 22 can have a peak dopant concentration of about $1.0\times10^{14}$ atoms/$cm^3$. First semiconductor region 14A and first doped region 22 are configured as first charge-balance region 142.

Figure 10:
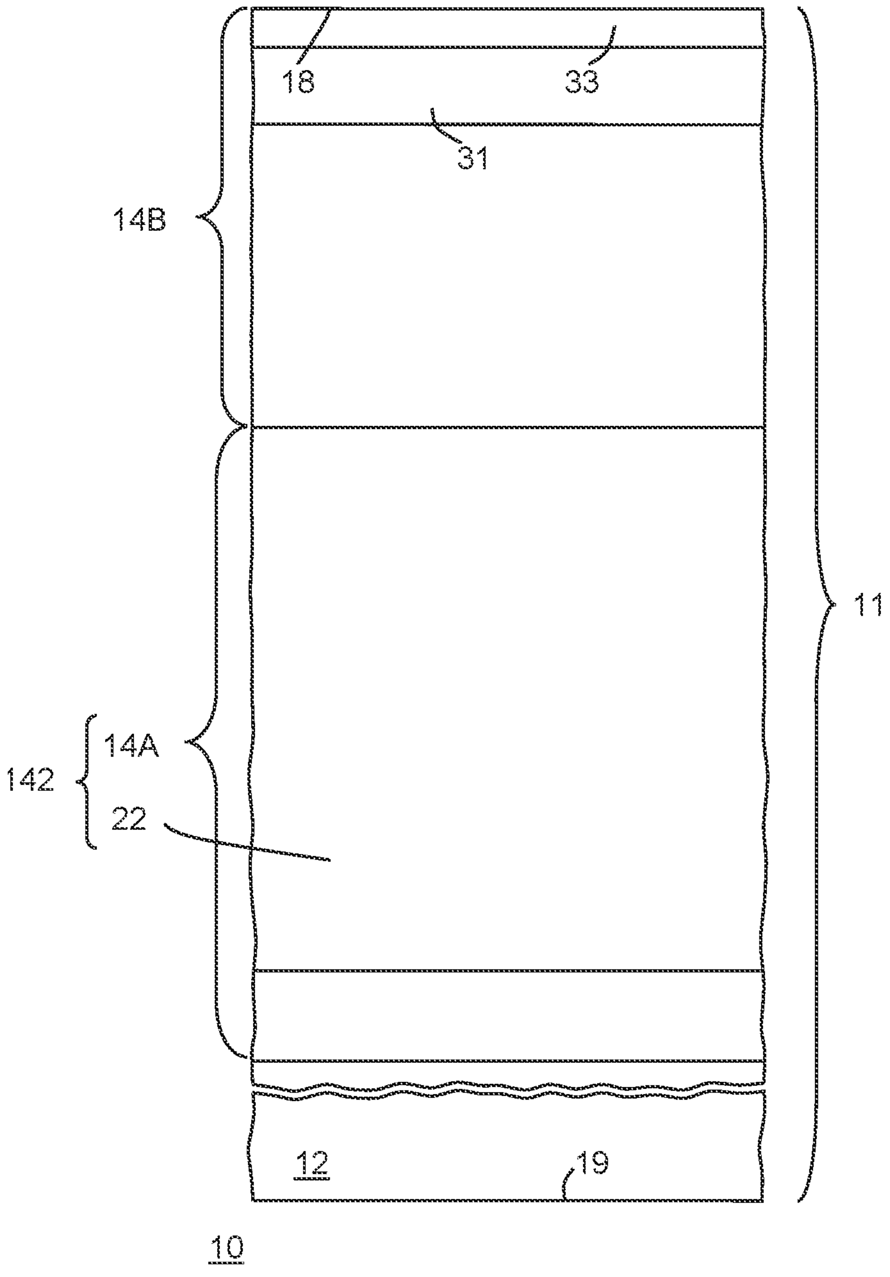

FIG. 10 illustrates a partial cross-sectional view of semiconductor device 10 after additional processing. In the present example, second semiconductor region 14B is provided over first semiconductor region 14A. In some examples, first semiconductor region 14B comprises a SiC epitaxial region comprising N-type conductivity formed using epitaxial growth process techniques with phosphorous or nitrogen doping. In some examples, first semiconductor region 14A comprises a dopant concentration in a range from about $5.0\times10^{16}$ atoms/$cm^3$ to about $5.0\times10^{17}$ atoms/$cm^3$ and can have thickness in a range from about 0.5 microns to about 3.0 microns. In the present example, substrate 12, first semiconductor region 14A, and second semiconductor region 14B provide body of semiconductor material 11.

Doped region 31 can then be provided within or in second semiconductor region 14B. In some examples, doped region 31 can be formed using ion implantation. In some examples, an aluminum dopant source can be used with one or more ion implant doses in a range from about $2.0\times10^{13}$ atoms/$cm^2$ to about $6.0\times10^{14}$ atoms/$cm^2$ and an ion implant energy in a range from about 150 keV to about 400 keV. Doped region 33 can then be provided within or in doped region 31. In some examples, doped region 33 can be formed using ion implantation with a phosphorous or nitrogen dopant source. In some examples, doped region 33 can have a peak dopant concentration greater than about $3.0\times10^{19}$ atoms/$cm^3$.

Figure 11:
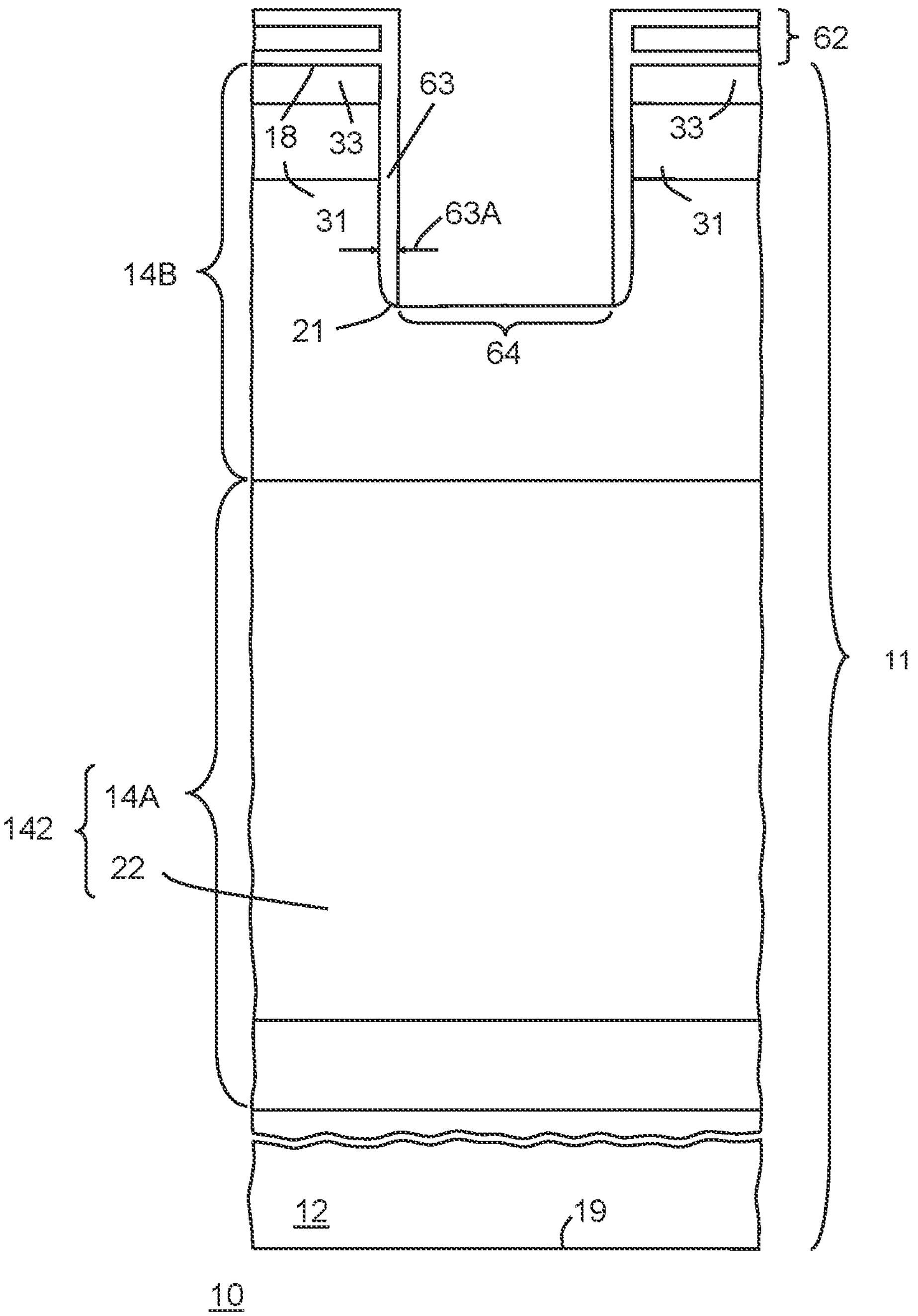

FIG. 11 illustrates a partial cross-sectional view of semiconductor device 10 after additional processing. In some examples, a mask 62 is provided over top side 18 of body of semiconductor material 11. In some examples, mask 62 can comprise one or more dielectrics. In other examples, mask 62 can comprise an organic material. Mask 62 is patterned to provide openings to expose portions of top side 18 where trench 21 will be provided. Mask 62 can also be referred to as a hard mask or a masking structure. Trench 21 can then be provided within or in second semiconductor region 14B extending from top side 18. In some examples, a dry etching process can be used to provide trench 21. In other examples, a wet etching process can be used. In some examples, trench 21 extends to a depth of about 1.0 microns into second semiconductor region 14B.

In accordance with the present description, a spacer 63 is provided along the side walls of trench 21. In some examples, spacer 63 comprises a dielectric, such as an oxide or a nitride, which can be provided using chemical vapor deposition (CVD) techniques. In a first step, the dielectric can be deposited over top side 18, the side walls of trench 21, and the lower side of trench 21. An anisotropic etch can then be used to remove the dielectric from the lower side of trench 21 to provide an opening 64. Spacer 63 comprises a thickness 63A that is pre-selected to place doped region 23 inset a lateral distance 231 (shown in FIG. 12) inward from the side walls of trench 21. In some examples, thickness 63A comprises a thickness in a range from about 200 Angstroms to about 1000 Angstroms. Applicant found that by placing doped region 23 laterally inward from the side walls of trench 21, an improved short circuit withstand time (SCWT) is achieved by, for example, adding a JFET resistance in series with channel regions 45 of semiconductor device 10.

Figure 12:
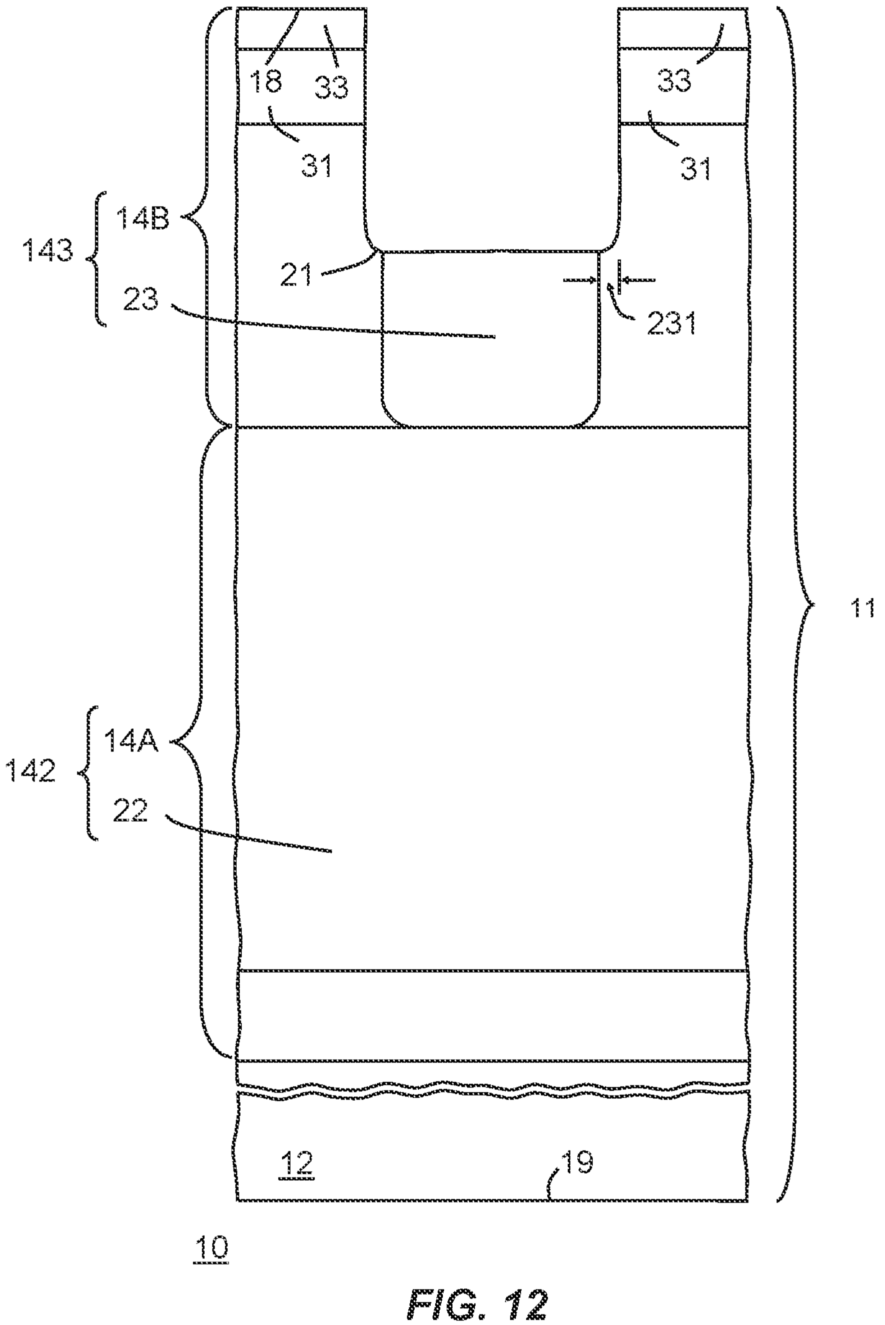

FIG. 12 illustrates a partial cross-sectional view of semiconductor device 10 after additional processing. In some examples, second doped region 23 is provided within or in second semiconductor region 14B through opening 64 defined by spacer 63. By using spacer 63, second doped region 23 is self-aligned with trench 21 in accordance with the present description. In some examples, ion implantation is used to provide second doped region 23 using with an aluminum dopant source, an ion implantation dose in a range from about $2.0\times10^{12}$ atoms/$cm^2$ to $5.0\times10^{13}$ atoms/$cm^2$, and ion implantation energy in a range from about 50 keV to about 3.0 MeV. In some examples, multiple ion implants can be used with different doses or different energies. Thermal processing can then be used to redistribute and activate the implanted dopant to provide second doped region 23. In some examples, second doped region 23 can have a peak dopant concentration of about $1.0\times10^{14}$ atoms/$cm^3$. In some examples, second doped region 23 is coupled electrically and physically to first doped region 22. In some examples, second doped region 23 can partially extend into an upper part of first doped region 22. After second doped region 23 is formed, spacer 63 can be removed using an etching process, which can also remove a portion of second semiconductor region 14B bounding trench 21. As illustrated in FIG. 12 second doped region 23 is inset lateral distance 231 from the side walls of trench 21 as set by spacer 63. Second doped region 23 is interposed between trench 21 and first doped region 22. Second doped region 23 and second semiconductor region 14B provide second charge-balance region 143. It is understood that first doped region 22 can be provided as first elongate stripe doped regions 220 and second doped region 23 can be provided as second elongate stripe doped regions 230. In some examples, first elongate stripe doped regions 220 and second elongate stripe doped regions 230 are non-parallel or orthogonal with respect to each other.

Figure 13:
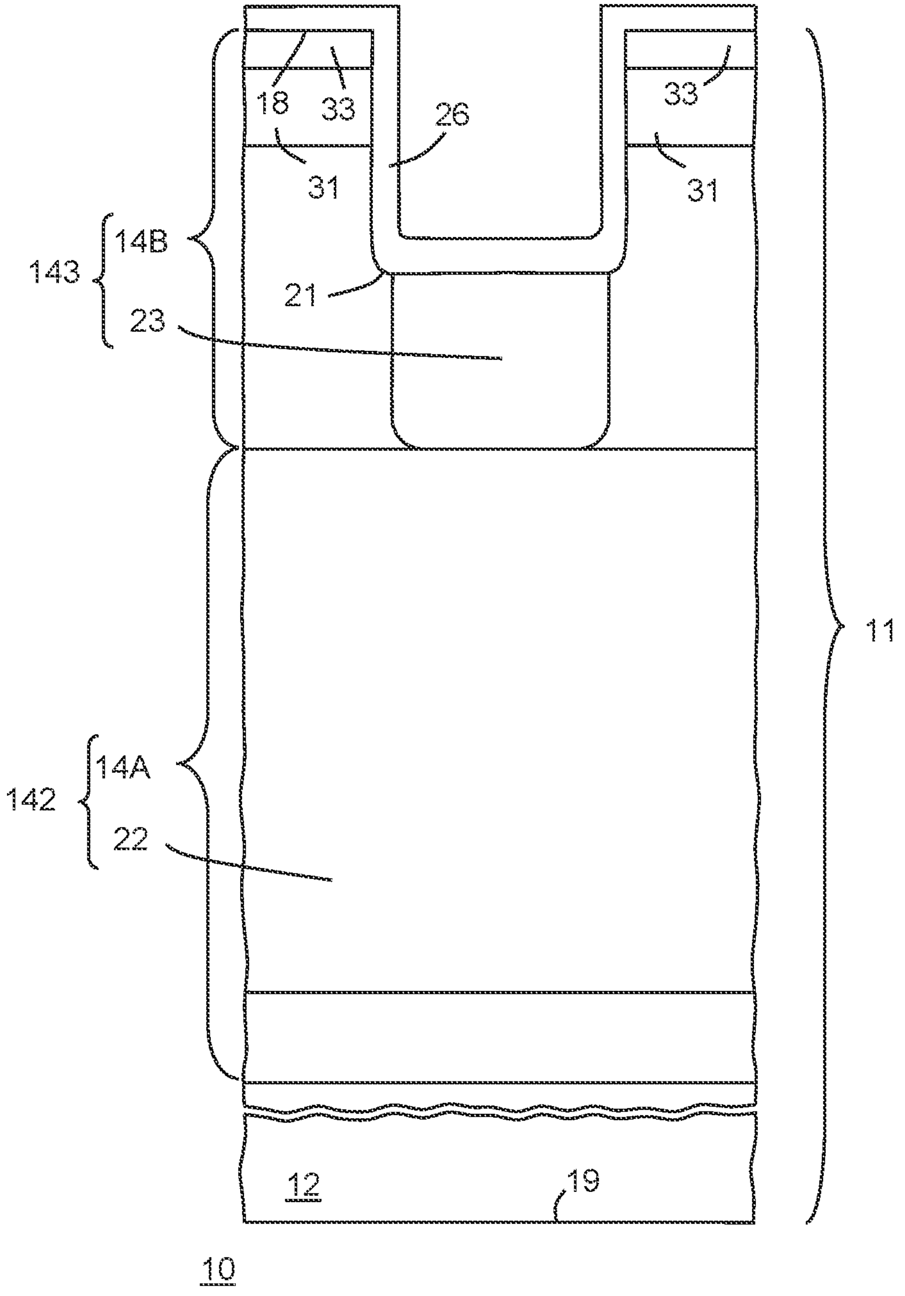

FIG. 13 illustrates a partial cross-sectional view of semiconductor device 10 after additional processing. In some examples, gate dielectric 26 is provided within or in trench 21 along the side walls and the lower side. Gate dielectric 26 can comprise one or more insulating materials. In some examples, gate dielectric 26 can comprise an oxide formed using, for example, thermal oxidation techniques. Gate dielectric 26 can comprise first portion 26A along the side walls of trench 21 and a second portion 26B at the lower side of trench 21. In some examples, gate dielectric 26 can have a thickness in a range from about 200 Angstroms to about 1000 Angstroms. In some examples, first portion 26A comprises a first thickness and second portion 26B comprises a second thickness that is greater than the first thickness. In some examples, this configuration of gate dielectric 26 reduces switching losses. In some examples, the second thickness can be about 1.2× to about 10× greater than the first thickness.

In subsequent steps and with reference back to FIG. 1, conductor 28 can be provided over dielectric 26, dielectric 41 can be provided over top side 18, openings can be provided in dielectric 41, contact vias can be formed in second semiconductor region 14B, and doped region 36 provided in doped region 31. In some examples, conductor 28 comprises a doped polycrystalline semiconductor material, such as doped polysilicon. The polysilicon can be doped with an N-type conductivity dopant or a P-type conductivity dopant. In some examples, conductor 28 can comprise a silicide or a metal. In some examples, dielectric 41 can comprise a layer of deposited silicon oxide doped with phosphorous or boron and phosphorous and at least one layer of undoped oxide. In some examples, dielectric 41 can have a thickness from about 0.4 microns to about 1.0 microns. Dielectric 41 can be planarized to provide a more uniform surface topography, which improves manufacturability. The contact vias can be provided using masking and etch techniques. Doped region 36 can be formed using ion implantation and anneal techniques.

In further steps, conductor 44 can be provided over top side 18 and coupled to doped region 33, doped region 36, and doped region 31. In some examples, first doped region 22 and second doped region 23 are coupled to conductor 44 through doped regions 221 and 222 at another location within semiconductor device 10 as illustrated in FIGS. 4 and 6. Portions of substrate 12 can be removed to reduce the overall thickness of body of semiconductor material 11 and conductor 46 can be provided at bottom side 19 of substrate 12.

In some examples, conductor 44 can comprise nickel, nickel silicide, titanium, or other conductive materials as known to one of ordinary skill in the art. In some examples, a conductor 46 is provided over bottom side 19 of body of semiconductor material 11 and is coupled to substrate 12. In some examples, conductor 46 can comprise a plurality of metal layers, such as nickel-titanium-nickel-silver, chrome-nickel-gold, or other conductive materials as known to one of ordinary skill in the art. Conductors 44 and 46 can be formed using deposition processes, such as evaporation, sputtering, or other techniques as known to one of ordinary skill in the art.

In summary, structures and methods have been described for a semiconductor device having improved manufacturability and performance. More particularly, a structure has been described that uses a first charge-balance structure including a first doped region and a second charge-balance structure including a second doped region. In some examples, the second doped region is provided self-aligned to a trench gate structure. In some examples, the second doped region is laterally inset from side walls of or laterally confided with respect to the trench gate structure. The configuration was found to improve short circuit withstand time (SCWT) by, for example, adding a JFET resistance in series with a channel region of the semiconductor device.

In some examples, the first doped region is provided as first elongate stripe doped regions and the second doped region is provided as second elongate stripe doped regions that are non-parallel to the first elongate stripe doped regions. In some examples, the second elongate stripe doped regions are orthogonal to the first elongate stripe doped regions. Applicant found that this non-parallel orientation improves the breakdown voltage performance of the semiconductor device by reducing sensitivity to misalignment between the second doped region and the first doped region during manufacturing.

In some examples, a third doped region can be provided proximate to where the second elongate stripe doped regions intersect or overlaps the first elongate stripe doped regions in the top view to provide further breakdown voltage performance improvement or to reduce specific on-resistance.

It is understood that the different examples described herein can be combined with any of the other examples described herein to obtain different embodiments.

While the subject matter of the invention is described with specific preferred examples, the foregoing drawings and descriptions thereof depict only typical examples of the subject matter and are not therefore to be considered limiting of its scope. It is evident that many alternatives and variations will be apparent to those skilled in the art. For example, the conductivity types of the various regions can be reversed.

As the claims hereinafter reflect, inventive aspects may lie in less than all features of a single foregoing disclosed example. Thus, the hereinafter expressed claims are hereby expressly incorporated into this Description, with each claim standing on its own as a separate example of the invention. Furthermore, while some examples described herein include some, but not other features included in other examples, combinations of features of different examples are meant to be within the scope of the invention and meant to form different examples as would be understood by those skilled in the art.

What is claimed is:

1. A semiconductor device, comprising:
a body of semiconductor material comprising:
a substrate;
a first semiconductor region over the substrate and comprising a first conductivity type; and
a second semiconductor region over the first semiconductor region and comprising the first conductivity type;
wherein:
the second semiconductor region provides a first side of the body of semiconductor and the substrate provides a second side of the body of semiconductor material opposite to the first side;
a trench gate structure comprising:
a trench extending into the second semiconductor region from the first side;
a gate conductor in the trench; and
a gate dielectric separating the gate conductor from the second semiconductor region;
a first elongate stripe doped region of a second conductivity type opposite to the first conductivity type in the first semiconductor region, wherein the first elongate stripe doped region and the first semiconductor region provide a first charge-balance region; and
a second elongate stripe doped region of the second conductivity type in the second semiconductor region and interposed between the trench gate structure and the first elongate stripe doped region, wherein the second elongate stripe doped region and the second semiconductor region provide a second a second charge-balance region;
wherein:
the second elongate stripe doped region is orthogonal to the first elongate stripe doped region in a top view; and
the second elongate stripe doped region is self-aligned to the trench gate structure.

2. The semiconductor device of claim 1, wherein:
the second elongate stripe doped region contacts the first elongate stripe doped region below the trench gate structure.

3. The semiconductor device of claim 1, wherein:
the first charge-balance region comprises a first plurality of elongate stripe doped regions within the first semiconductor region including the first elongate stripe doped region;
the second charge-balance region comprises a second plurality of elongate stripe doped regions in the second semiconductor region including the second elongate stripe doped region; and
the second plurality of elongate stripe doped regions is orthogonal to the first plurality of elongate stripe doped regions in the top view.

4. The semiconductor device of claim 1, wherein:
the first semiconductor region comprises SiC.

5. The semiconductor device of claim 1, wherein:
the second semiconductor region comprises SiC.

6. The semiconductor device of claim 1, further comprising:
a localized doped region comprising the first conductivity type within the body of semiconductor material where the first elongate stripe doped region and the second elongate stripe doped region intersect in the top view.

7. The semiconductor device of claim 1, wherein:
the trench comprises side walls and a lower side; and
the gate dielectric comprises:
a first portion along the side walls of the trench and comprising a first thickness; and
a second portion at the lower side of the trench and comprising a second thickness that is greater than the first thickness.

8. The semiconductor device of claim 1, wherein:
the trench comprises a sidewall in a cross-sectional view; and
the second elongate stripe doped region is laterally inset with respect to the sidewall in the cross-sectional view.

9. The semiconductor device of claim 1, further comprising:
a body region of the second conductivity type within the second semiconductor region adjacent to the trench gate structure; and
a source region of the first conductivity type within the body region;
wherein:
the first elongate stripe doped region and the second elongate stripe doped region are coupled to the source region.

10. The semiconductor device of claim 1, further comprising:
a doped region of the second conductivity type extending from the first side into the body of semiconductor material and contacting the first elongate stripe doped region.

11. A semiconductor device, comprising:
a body of semiconductor material comprising:
a substrate;
a first semiconductor region over the substrate and comprising a first conductivity type; and
a second semiconductor region over the first semiconductor region and comprising the first conductivity type;
wherein:
the second semiconductor region comprises a first side of the body of semiconductor and the substrate comprises a second side of the body of semiconductor material opposite to the first side;
a trench gate structure comprising:
a trench extending into the second semiconductor region from the first side;
a gate conductor in the trench; and
a gate dielectric separating the gate conductor from the second semiconductor region;
a first doped region of a second conductivity type opposite to the first conductivity type in the first semiconductor region, wherein the first doped region and the first semiconductor region provide a first charge-balance region; and
a second doped region of the second conductivity type in the second semiconductor region and interposed between the trench gate structure and the first doped region, wherein the second doped region and the second semiconductor region provide a second charge-balance region;
wherein:

the second doped region is self-aligned with the trench gate structure.

12. The semiconductor device of claim 11, wherein:

the first doped region comprises a first elongate stripe doped region;

the second doped region comprises a second elongate stripe doped region; and the second elongate stripe doped region is orthogonal to the first elongate stripe doped region in a top view.

13. The semiconductor device of claim 12, further comprising:

a localized doped region comprising the first conductivity type within the body of semiconductor material where the first elongate stripe doped region and the second elongate stripe doped region intersect in the top view.

14. The semiconductor device of claim 11, wherein:

the first semiconductor region and the second semiconductor region comprise SiC.

15. The semiconductor device of claim 11, further comprising:

a third doped region of the second conductivity type extending from the first side into the body of semiconductor material and contacting the first doped region;

a body region of the second conductivity type within the second semiconductor region adjacent to the trench gate structure; and a source region of the first conductivity type within the body region;

wherein:

the first doped region and the second doped region are coupled to the source region.

16. A method of manufacturing a semiconductor device, comprising:

providing a substrate;

providing a first semiconductor region over the substrate and comprising a first conductivity type;

providing a first doped region of a second conductivity type opposite to the first conductivity type in the first semiconductor region, wherein the first doped region and the first semiconductor region provide a first charge-balance region;

providing a second semiconductor region over the first semiconductor region and comprising the first conductivity type;

providing a trench extending into the second semiconductor region, the trench comprising side walls and a lower side;

providing a spacer structure along the side walls of the trench;

using the spacer structure to provide a second doped region of the second conductivity type in the second semiconductor region and interposed between the lower side of the trench and the first doped region, wherein the second doped region and the second semiconductor region provide a second charge-balance region;

providing a gate dielectric along the side walls and the lower side of the trench; and providing a gate conductor in the trench, wherein the gate dielectric isolates the gate conductor from the second semiconductor region and the second doped region.

17. The method of claim 16, wherein:

providing the first semiconductor region comprises providing the first semiconductor region comprising SiC;

providing the first doped region comprises providing a first elongate stripe doped region;

providing the second semiconductor region comprises providing the second semiconductor region comprising SiC; and providing the second doped region comprises providing a second elongate stripe doped region.

18. The method of claim 17, wherein:

providing the second elongate stripe doped region comprises providing the second elongate stripe doped region orthogonal to the first elongate stripe doped region in a top view.

19. The method of claim 18, further comprising:

providing a localized doped region comprising the first conductivity type to counter-dope one or more of the first elongate stripe doped region or the second elongate stripe doped region at a location where the first elongate stripe doped region and the second elongate stripe doped region intersect in the top view.

20. The method of claim 16, further comprising:

providing a body region of the second conductivity type within the second semiconductor region adjacent to the trench;

providing a source region of the first conductivity type within the body region; and coupling the first doped region and the second doped region to the source region; and providing a third doped region of the second conductivity type extending through the second semiconductor region and contacting the first doped region.

* * * * *